United States Patent
Huang et al.

(10) Patent No.: US 10,325,808 B2
(45) Date of Patent: Jun. 18, 2019

(54) CRACK PREVENT AND STOP FOR THIN GLASS SUBSTRATES

(71) Applicant: GLOBALFOUNDRIES Inc., Grand Cayman (KY)

(72) Inventors: Ivan Huang, Pleasanton, CA (US); Elavarasan Pannerselvam, Milpitas, CA (US); Vijay Sukumaran, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 6 days.

(21) Appl. No.: 15/858,691

(22) Filed: Dec. 29, 2017

(65) Prior Publication Data

US 2018/0182671 A1 Jun. 28, 2018

Related U.S. Application Data

(62) Division of application No. 15/392,042, filed on Dec. 28, 2016, now Pat. No. 9,892,971.

(51) Int. Cl.
| | |
|---|---|
| H01L 21/78 | (2006.01) |
| H01L 21/02 | (2006.01) |
| H01L 21/027 | (2006.01) |
| H01L 21/263 | (2006.01) |
| H01L 21/268 | (2006.01) |
| H01L 21/3065 | (2006.01) |
| H01L 21/56 | (2006.01) |
| H01L 23/00 | (2006.01) |

(52) U.S. Cl.
CPC .......... *H01L 21/78* (2013.01); *H01L 21/0273* (2013.01); *H01L 21/02118* (2013.01); *H01L 21/268* (2013.01); *H01L 21/2633* (2013.01); *H01L 21/3065* (2013.01); *H01L 21/561* (2013.01); *H01L 23/562* (2013.01)

(58) Field of Classification Search
None
See application file for complete search history.

(56) References Cited

U.S. PATENT DOCUMENTS

| 7,955,955 B2 | 6/2011 | Lane et al. |
| 9,059,167 B2 | 6/2015 | Farooq et al. |
| 2006/0264035 A1 | 11/2006 | Nogami |

(Continued)

*Primary Examiner* — Khaja Ahmad
(74) *Attorney, Agent, or Firm* — Ditthavong & Steiner, P.C.

(57) ABSTRACT

A method of forming a 3D crack-stop structure in, through, and wrapped around the edges of a substrate to prevent through-substrate cracks from propagating and breaking the substrate and the resulting device are provided. Embodiments include providing a substrate including one or more dies; forming a continuous first trench near an outer edge of the substrate; forming a continuous second trench parallel to and on an opposite side of the first trench from the outer edge; forming a continuous row of vias parallel to and on an opposite side of the second trench from the first trench, forming a continuous third trench parallel to and near an outer edge of each of the dies; forming a protective layer wrapping around the outer edge of the substrate and over and filling the trenches and vias; and patterning active areas of the substrate between the vias and the third trench.

20 Claims, 2 Drawing Sheets

(56) References Cited

U.S. PATENT DOCUMENTS

| | | | |
|---|---|---|---|
| 2009/0004864 A1* | 1/2009 | Kim | H01L 21/3212 |
| | | | 438/693 |
| 2009/0127652 A1* | 5/2009 | Ding | H01L 21/76 |
| | | | 257/508 |
| 2011/0193197 A1* | 8/2011 | Farooq | H01L 21/76898 |
| | | | 257/618 |
| 2011/0278722 A1* | 11/2011 | Miki | H01L 21/6836 |
| | | | 257/737 |
| 2012/0313222 A1* | 12/2012 | Lee | H01L 21/561 |
| | | | 257/620 |

* cited by examiner

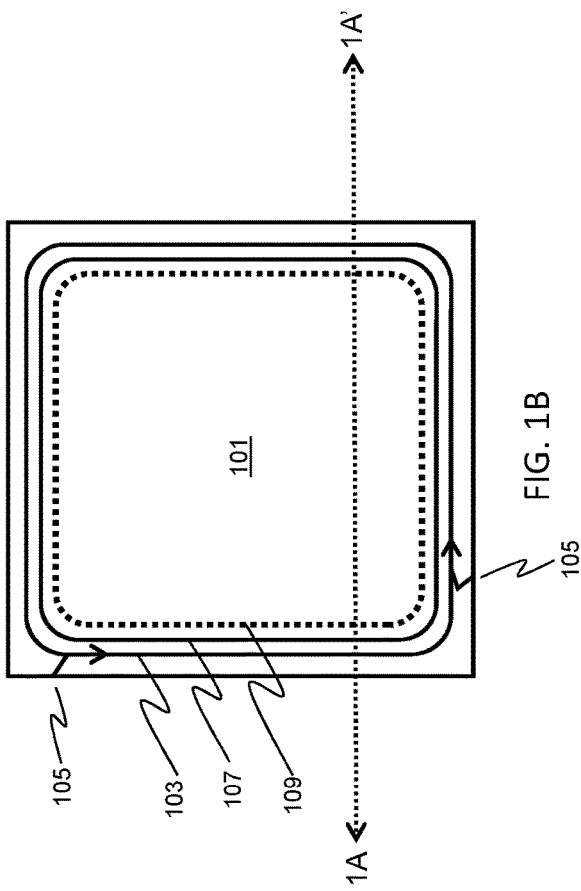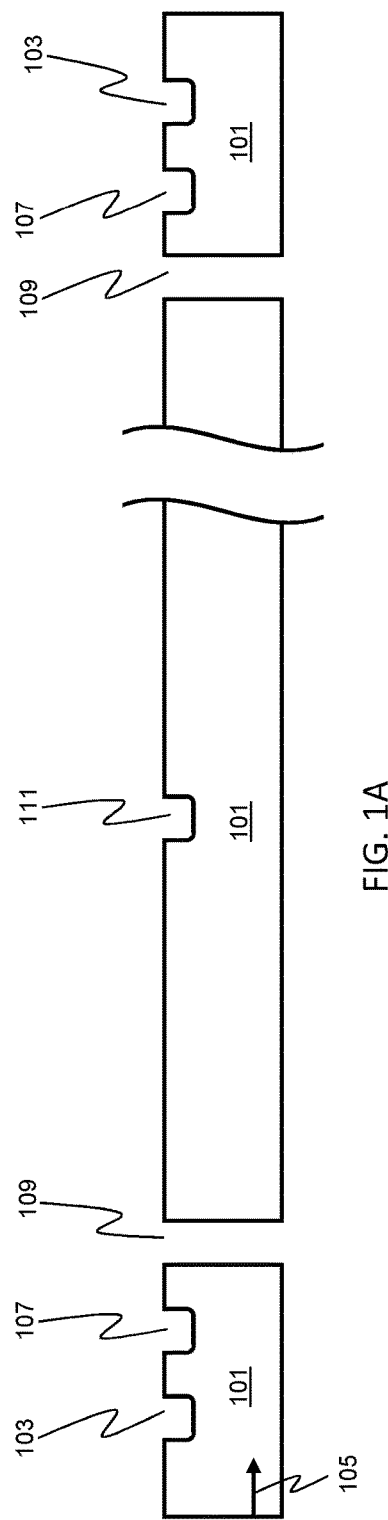

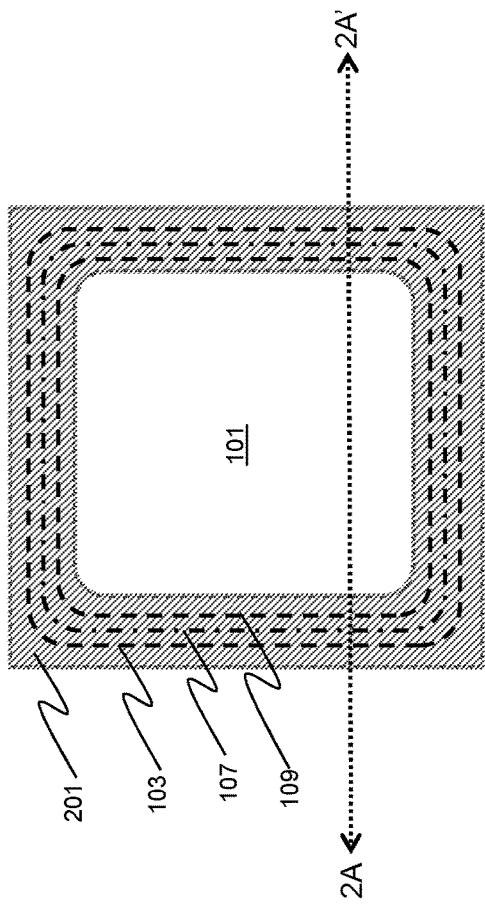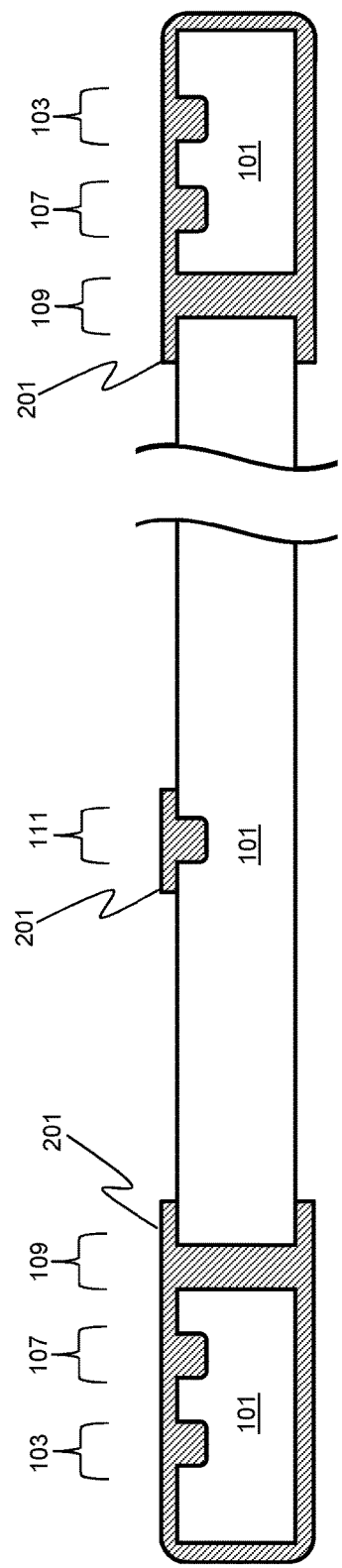

CRACK PREVENT AND STOP FOR THIN GLASS SUBSTRATES

RELATED APPLICATION

The present application is a Divisional of application Ser. No. 15/392,042, filed on Dec. 28, 2016, which is incorporated herein by reference in its entirety.

TECHNICAL FIELD

The present disclosure relates to the manufacturing and handling of integrated microelectronic device substrates. The present disclosure is particularly applicable to crack prevention for integrated microelectronic device substrates.

BACKGROUND

Thin glass substrates are generally more brittle than silicon (Si) substrates typically used in the manufacture of integrated microelectronic devices. Edges of the glass substrate can easily become chipped and/or damaged from handling during the manufacturing process. These chipped and/or damaged regions often become crack-initiation points that dramatically reduce the strength of the substrate. Consequently, thin glass substrates readily break or completely shatter, resulting in yield loss, process equipment contamination, and sometimes damage to the equipment. Known methods of forming crack-stop features have thus far focused on stopping in-plane cracks that occur between layers of film. However, these methods only prevent inter-layer cracks and do not address substrate breakage. In addition, such methods have been limited to two-dimensional structures.

A need therefore exists for methodology enabling prevention of through-substrate cracks from propagating and damaging a wafer and the resulting device.

SUMMARY

An aspect of the present disclosure is method of forming a three-dimensional (3D) crack-stop structure in, through, and wrapped around the edges of an integrated microelectronic substrate to prevent through-substrate cracks from propagating and breaking the substrate.

Another aspect of the present disclosure is a device including a 3D crack-stop structure formed in, through, and wrapped around the edges of an integrated microelectronic substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a substrate including one or more dies; forming a continuous first trench near an outer edge of the substrate; forming a continuous second trench parallel to and on an opposite side of the first trench from the outer edge; forming a continuous row of vias parallel to and on an opposite side of the second trench from the first trench, each via formed equidistant from one another; forming a continuous third trench parallel to and near an outer edge of each of the one or more dies; forming a protective layer wrapping around the outer edge of the substrate and over and filling the first, second, and third trenches and the row of vias; and patterning active areas of the substrate between the row of vias and the third trench.

Aspects of the present disclosure include forming the first trench at least 50 micrometer (μm) from the outer edge of the substrate. Other aspects include forming each of the first, second, and third trenches with a width and a depth of 10 μm to 50 μm. Further aspects include forming a spacing between the first and second trenches and between the second trench and the row of vias equal to the width of the second trench; and forming a spacing between the third trench and the outer edge of each of the one or more dies equal to the width of the third trench. Additional aspects include forming the first, second, and third trenches and the row of vias by dicing, deep reactive-ion etching (DRIE), or laser etching. Another aspect includes forming the protective layer with a thickness of 5 μm to 10 μm above an upper surface and around an outer surface of the substrate. Other aspects include forming the protective layer of spin-on photo-imagable polyimide, polybenzoxazole (PBO), hardbaked photoresist, curable paste, photo-imagable dry film, or other dispensed and cured polymer films.

Another aspect of the present disclosure is a device including: a substrate including one or more dies; a continuous first trench formed near an outer edge of the substrate; a continuous second trench formed parallel to and on an opposite side of the first trench from the outer edge; a continuous row of vias formed parallel to and on an opposite side of the second trench from the first trench, the vias formed equidistant from one another; a continuous third trench formed near an outer edge of each of the one or more dies; a protective layer wrapped around the outer edge of the substrate and formed over and in the first, second, and third trenches and the row of vias; and active areas of the substrate patterned between the row of vias and the third trench.

Aspects of the device include the substrate being glass, Si, silicon germanium (SiGe), or gallium arsenic (GaAs). Other aspects include the first trench being formed at least 50 μm from the outer edge of the substrate. Further aspects include the first, second, and third trenches each having a depth of 10 μm to 50 μm. Another aspect includes the first, second, and third trenches each having a width of 10 μm to 50 μm. Additional aspects include a spacing between the first and second trenches and between the second trench and the row of vias equal to the width of the second trench. Other aspects include a spacing between the third trench and the outer edge of each of the one or more dies equaling the width of the third trench. Further aspects include the protective layer being spin-on photo-imagable polyimide, PBO, hardbaked photoresist, curable paste, photo-imagable dry film, or other dispensed and cured polymer films.

A further aspect of the present disclosure is method including: providing a glass substrate including one or more dies; forming a continuous first trench 50 μm from the outer edge of the substrate; forming a continuous second trench parallel to and on an opposite side of the first trench from the outer edge; forming a continuous row of vias parallel to and on an opposite side of the second trench from the first trench, each via formed equidistant from one another; forming a continuous third trench parallel to and near an outer edge of each of the one or more dies; stripping the substrate; forming a protective layer of spin-on photo-imagable polyimide, PBO, hardbaked photoresist, curable paste, photo-imagable dry film, or other dispensed and cured polymer film to a thickness of 5 μm to 10 μm wrapping around the outer edge of the substrate and over and filling the first, second, and third trenches and the row of vias; and patterning active areas of the substrate between the row of vias and the third trench.

Aspects of the present disclosure include forming the first, second, and third trenches with a width and a depth of 10 µm to 50 um. Other aspects include forming a spacing between the first and second trenches and between the second trench and the row of vias equal to the width of the second trench; and forming a spacing between the third trench and the outer edge of each of the one or more dies equal to the width of the third trench. Further aspects include forming the first, second, and third trenches and the row of vias by dicing, DRIE, or laser etching.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 2A schematically illustrate cross-sectional views of a process flow for forming a 3D crack-stop structure in, through, and wrapped around the edges of an integrated microelectronic substrate, in accordance with an exemplary embodiment; and FIGS. 1B and 2B schematically illustrate top views of FIGS. 1A and 1B, respectively.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of thin glass or brittle substrates readily being chipped and/or damaged during handling, thereby leading to the substrates breaking or completely shattering attendant upon manufacturing integrated microelectronic devices.

Methodology in accordance with embodiments of the present disclosure includes providing a substrate including one or more dies. A continuous first trench is formed near an outer edge of the substrate and a continuous second trench is formed parallel to and on an opposite side of the first trench from the outer edge. A continuous row of vias is formed parallel to and on an opposite side of the second trench from the first trench, the vias formed equidistant from one another. A continuous third trench is formed parallel to and near an outer edge of each of the one or more dies and a protective layer is formed wrapping around the outer edge of the substrate and over and filling the first, second, and third trenches and the row of vias. The active areas of the substrate are then patterned between the row of vias and the third trench.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A and 2A schematically illustrate cross-sectional views of a process flow for forming a 3D crack-stop structure in, through, and wrapped around the edges of an integrated microelectronic substrate along the lines 1A-1A' and 2A-2A' of FIGS. 1B and 2B, respectively, and FIGS. 1B and 2B are top views. FIGS. 1B and 2B are rudimentarily depicted for illustrative purposes and are not complete top views. Adverting to FIG. 1A, a substrate 101 including one or more dies (not shown for illustrative convenience) is provided. The substrate 101 may be formed, e.g., of thin glass, Si, SiGe, or GaAs. Once the substrate 101 is cleaned by conventional cleaning processes, a continuous trench 103 is formed, e.g., by patterning and then dicing, DRIE, or laser etching, in and around the outer edge or periphery of the substrate 101. The trench 103 is formed near, but at least 50 µm from, the edge of the substrate 101 to maximize the available active area on the substrate 101. The trench 103 is formed, e.g., with a width and a depth of 10 µm to 50 µm. Forming the trench 103 with a shallower depth is beneficial in terms of requiring less processing time; however, the trench 103 needs to be formed with enough depth to create a vertical wall, since it requires more energy for an edge crack to propagate (as depicted by the arrows 105) over a vertical wall of a trench than to simply stop or get diverted away from the active areas of the substrate 101.

A continuous trench 107 is formed similar to trench 103, parallel to and on the opposite side of the trench 103 from the outer edge of the substrate 101. The trench 107 is formed the width of trench 107 away from the trench 103. For example, if the width of trenches 103 and 107 is 25 µm, then the pitch between the trenches 103 and 107 (center-to-center) would be 50 µm, and the edge-to-edge spacing between the trenches 103 and 107 would be 25 µm.

A row of vias 109 is formed, e.g., at the same time that standard through vias are formed on the substrate 101, parallel to and on the opposite side of the trench 107 from the trench 103, thereby avoiding the need for additional processing steps. The distance between the row of vias 109 and the trench 107 is the same as the distance between the trenches 103 and 107. Similarly, the distance between the vias 109 is the same as the distance between the row of vias 109 and the trench 107. For example, a 25 µm diameter via 109 would have a 50 µm pitch between each adjacent via 109 (center-to-center). The trenches 103 and 107 and the row of vias 109 may be formed at the same time or the row of vias 109 may alternatively be formed before the trenches 103 and 107 are formed.

A continuous trench 111 (not shown in the top view) is formed similar to the trenches 103 and 107, parallel to and near the outer edge of each of the one or more dies. The edge-to-edge spacing between the trench 111 and the edge of each die is equivalent to the width of trench 111 or the diameter of a via 109. For example, if the width of the trench 111 is 25 μm, then the trench 111 should be no closer than 25 μm to the outer edge of the die. The substrate 101 is then stripped using conventional stripping processes.

Adverting to FIGS. 2A and 2B, a protective layer 201 is formed, e.g., of spin-on photo-imagable polyimide, PBO, hardbaked photoresist, curable paste, photo-imagable dry film, or other dispensed and cured polymer films, over the substrate 101, in the trenches 103, 107, and 111 and the row of vias 109, and wrapped around the outer edge of the substrate 101. The protective layer 201 is formed, e.g., with a thickness of 5 μm to 10 μm above the upper surface of the substrate 101. The active areas of the substrate 101 are then patterned and cleared so that processing of the active devices can proceed as normal while the trenches 103, 107, and 111 and the row of vias 109 remain filled by the protective layer 201. Consequently, the protective layer 201 acts as the crack prevention level, i.e., dissipating the crack energy, and the trenches 103, 107, and 111 and the row of vias 109 act as the crack-stop level in case any cracks propagate, i.e., diverting the crack energy.

The embodiments of the present disclosure can achieve several technical effects including preventing and eliminating chipped and/or damaged substrate edges, preventing through-substrate cracks from propagating and breaking the substrate, protecting the substrate as a whole as well as the active regions of the substrate, and improving dicing yields. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of integrated microelectronic devices, particularly those formed from thin glass or brittle substrates.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a substrate including one or more dies;
   a continuous first trench formed near an outer edge of the substrate;
   a continuous second trench formed parallel to and on an opposite side of the first trench from the outer edge;
   a continuous row of vias formed parallel to and on an opposite side of the second trench from the first trench, each via formed equidistant from one another;
   a continuous third trench formed near an outer edge of each of the one or more dies;
   a protective layer wrapped around the outer edge of the substrate and formed over and in the first, second, and third trenches and the row of vias; and
   active areas of the substrate patterned between the row of vias and the third trench.

2. The device according to claim 1, wherein the substrate comprises glass, silicon (Si), silicon germanium (SiGe), or gallium arsenic (GaAs).

3. The device according to claim 1, wherein the first trench is formed at least 50 micrometer (μm) from the outer edge of the substrate.

4. The device according to claim 1, wherein the first, second, and third trenches each have a depth of 10 μm to 50 μm.

5. The device according to claim 1, wherein the first, second, and third trenches each have a width of 10 μm to 50 μm.

6. The device according to claim 5, wherein a spacing between the first and second trenches and between the second trench and the row of vias is equal to the width of the second trench.

7. The device according to claim 5, wherein a spacing between the third trench and the outer edge of each of the one or more dies equals the width of the third trench.

8. The device according to claim 1, wherein the protective layer is formed with a thickness of 5 μm to 10 μm above an upper surface and around an outer surface of the substrate.

9. The device according to claim 2, wherein the protective layer comprises spin-on photo-imagable polyimide, polybenzoxazole (PBO), hardbaked photoresist, curable paste, photo-imagable dry film, or other dispensed and cured polymer films.

10. A device comprising:
    a substrate including one or more dies;
    a continuous first trench formed near an outer edge of the substrate;
    a continuous second trench formed parallel to and on an opposite side of the first trench from the outer edge;
    a continuous row of vias formed parallel to and on an opposite side of the second trench from the first trench, each via formed equidistant from one another and extending entirely through the substrate;
    a continuous third trench formed near an outer edge of each of the one or more dies;
    a protective layer wrapped around the outer edge of the substrate and formed over and in the first, second, and third trenches and the row of vias; and
    active areas of the substrate patterned between the row of vias and the third trench,
    wherein the first, second and third trenches extend a portion through the substrate.

11. The device according to claim 10, wherein the substrate comprises glass, silicon (Si), silicon germanium (SiGe), or gallium arsenic (GaAs).

12. The device according to claim 10, wherein a spacing between the first and second trenches and between the second trench and the row of vias is equal to the width of the second trench.

13. The device according to claim 10, wherein a spacing between the third trench and the outer edge of each of the one or more dies equals the width of the third trench.

14. The device according to claim 10, wherein the protective layer is formed with a thickness of 5 μm to 10 μm above an upper surface and around an outer surface of the substrate.

15. The device according to claim 10, wherein the protective layer comprises spin-on photo-imagable polyimide, polybenzoxazole (PBO), hardbaked photoresist, curable paste, photo-imagable dry film, or other dispensed and cured polymer films.

16. A device comprising:
    a substrate including one or more dies;

a continuous first trench formed near an outer edge of the substrate;

a continuous second trench formed parallel to and on an opposite side of the first trench from the outer edge;

a continuous row of vias formed parallel to and on an opposite side of the second trench from the first trench, each via formed equidistant from one another and extending entirely through the substrate;

a continuous third trench formed near an outer edge of each of the one or more dies; and a protective layer wrapped around the outer edge of the substrate, wherein the first, second and third trenches extend a portion through the substrate.

17. The device according to claim 16, wherein the protective layer is formed over and in the first, second, and third trenches and the row of vias.

18. The device according to claim 16, further comprising:
active areas of the substrate patterned between the row of vias and the third trench.

19. The device according to claim 16, wherein the substrate comprises glass, silicon (Si), silicon germanium (SiGe), or gallium arsenic (GaAs).

20. The device according to claim 16, wherein a spacing between the first and second trenches and between the second trench and the row of vias is equal to the width of the second trench.

* * * * *